(12) United States Patent
Lee

(10) Patent No.: US 8,679,729 B2
(45) Date of Patent: Mar. 25, 2014

(54) METHOD FOR FORMING PATTERNS OF SEMICONDUCTOR DEVICE BY USING MIXED ASSIST FEATURE SYSTEM

(75) Inventor: Jeon Kyu Lee, Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 1021 days.

(21) Appl. No.: 12/268,588

(22) Filed: Nov. 11, 2008

(65) Prior Publication Data
US 2009/0317749 A1 Dec. 24, 2009

(30) Foreign Application Priority Data

Jun. 18, 2008 (KR) ........................ 10-2008-0057407

(51) Int. Cl.
*G03F 7/00* (2006.01)
(52) U.S. Cl.
USPC .............................................. 430/319; 430/5
(58) Field of Classification Search
USPC ..................................................... 430/5, 319
See application file for complete search history.

(56) References Cited

U.S. PATENT DOCUMENTS

| | | | |
|---|---|---|---|
| 6,693,315 B2 * | 2/2004 | Kuroda et al. | ................. 257/288 |
| 7,078,133 B2 | 7/2006 | Bauch et al. | |
| 2007/0035031 A1 | 2/2007 | Jessen et al. | |
| 2008/0063948 A1 | 3/2008 | O'Brien | |
| 2009/0232384 A1 * | 9/2009 | Tu et al. | ........................ 382/144 |

FOREIGN PATENT DOCUMENTS

| | | |
|---|---|---|
| CN | 1737680 | 2/2006 |
| JP | 2006-135047 | 5/2006 |
| JP | 2006-135112 | 5/2006 |
| KR | 1020000031110 A | 6/2000 |
| KR | 1020000045428 A | 7/2000 |
| KR | 1020070071104 A | 7/2007 |
| KR | 1020080010666 A | 1/2008 |
| TW | 2004-28485 | 12/2004 |
| TW | 2005-27655 | 8/2005 |
| TW | 2007-09276 | 3/2007 |

OTHER PUBLICATIONS

"Lithography process margin enhancement using illumination based assist pattern", James Moon, Dong-Jin Lee, Gui-Hwang Sim, Jae-Doo Eum, Byung-Ho Nam, and Dong Gyu Yim, Proc. of SPIE vol. 6283 (2006).*

* cited by examiner

*Primary Examiner* — Daborah Chacko Davis
(74) *Attorney, Agent, or Firm* — Kilpatrick Townsend & Stockton LLP

(57) ABSTRACT

Disclosed is a method for forming patterns of a semiconductor device, which includes: arranging dense patterns to be transferred in a dense pattern region of a wafer; inserting a first dummy pattern for restricting pattern distortion of the dense patterns in an outside of the array of the dense patterns; inserting a first assist feature for restricting pattern distortion of the first dummy pattern in an inside of the first dummy pattern; inserting an array of second assist features for additionally restricting pattern distortion of the first dummy pattern in an outside of the first dummy pattern, thereto designing a pattern layout to be transferred onto the wafer; and forming an array of the dense patterns and the first dummy patterns by transferring the pattern layout onto the wafer through an exposure.

11 Claims, 14 Drawing Sheets

METHOD FOR FORMING PATTERNS OF SEMICONDUCTOR DEVICE BY USING MIXED ASSIST FEATURE SYSTEM

CROSS-REFERENCE TO RELATED APPLICATIONS

The present application claims priority to Korean patent application number 10-2008-0057407, filed on Jun. 18, 2008, which is incorporated by reference in its entirety.

BACKGROUND OF THE INVENTION

The present invention relates to a semiconductor device, and more particularly, to a method for forming patterns by using a mixed assist feature system to transfer an accurate image on a boundary region between pattern dense region and pattern isolated region of substrate.

A microlithography process is carried out for realizing the semiconductor device on a wafer as circuit patterns. The microlithography process includes designing a layout of the patterns to be realized on a wafer and forming a photomask in which the designed pattern layout is realized on a transparent mask substrate as mask patterns. Then, the mask patterns are transferred onto a photoresist layer coated on the wafer through an exposure process using the photomask, thereby forming a photomask that follows the designed pattern layout. After that, a selective etch process using the photoresist patterns as an etch mask is carried out, thereby realizing, on the wafer, wafer patterns or target patterns that follows the designed pattern layout.

As a design rule of memory semiconductor devices such as a DRAM device and a NAND flash device is decreased, it is required a process of realizing patterns of finer critical dimension on the wafer. The process margin for exposing these fine patterns may vary as regions on the wafer dependently of dense degree of the patterns to be transferred. For example, the process margin window such as a defocus margin may be relatively narrowed in a region having relatively large spacing distance between the patterns, resulting in pattern transfer failures such as distortion of a pattern shape.

At a vicinity of a dense pattern region on the wafer such as a cell region in which cell patterns for unit memory cells are disposed, an isolated pattern region such as a peripheral in which a word line driver is disposed and a core region in which a sub word line driver is disposed is disposed. At this time, the patterns disposed in a boundary region between the regions may be transferred onto the wafer with their shape or form being undesirably deformed.

The cell patterns in the cell region are disposed so as to have substantially equal shape and spacing distance. However, In case of the cell patterns located at cell region and a region outside the cell region, e.g. a boundary between core regions, a first spacing distance from another pattern disposed outside the cell region is set to be relatively very larger than a second spacing distance from adjacent another pattern disposed inside the cell region. Therefore, exposure environment or interference degree between exposing lights in the boundary region applied when the cell patterns located in the boundary region is transferred onto the wafer through the exposure differs from the exposure environment or interference degree between exposing lights inside the cell region applied to the cell patterns disposed inside the cell region.

When carrying out the exposure employing same exposure environment or variables, the pattern transfer for cell patterns inside the cell region can be relatively accurately carried out, but the pattern transfer for cell patterns disposed in the boundary region may result in pattern defect in which the pattern shape is distorted. Therefore, the process margin of the exposure condition in which the cell patterns in the boundary region is transferred with an accuracy of a desired level becomes very narrow. For example, during the course of transferring an isolation pattern for realizing an active region with a target critical dimension of about 50 nm, it could be appreciated that extremely poor pattern transfer onto the boundary region is resulted under the defocus condition of about 0.29 μm when condition for the best exposure focus is 0.21 μm. That is to say, even minute defocus of several tens nm results in the poor pattern transfer.

Since memory semiconductor devices require a process of transferring and realizing patterns having various shapes, sizes and spacing distances onto the wafer, it is very difficult to realize a pattern forming process that is stable over the entire wafer with this very narrow defocus margin. Further, in order to overcome resolution limitation in the exposure process and realize the patterns of fine critical dimension on the wafer, an asymmetric illumination such as a dipole illumination has been introduced. This dipole illumination can improve image contrast to the pattern extending in a direction perpendicular to a pole axis along which corresponding two poles are disposed and thus enhance the resolution. However, this dipole illumination is accompanied with lowering in the resolution for the pattern extending in a direction parallel to the pole axis.

As the asymmetric illumination that provides asymmetric resolution to extension directions of the patterns is introduced as described above, factors causing the pattern defect act more seriously on the pattern disposed in the boundary region. Accordingly, the poor pattern transfer onto the patterns disposed in the boundary is more serious as the more extreme asymmetric illumination is introduced. That is to say, since the defocus margin becomes very narrow, it becomes more difficult to ensure the process margin in the exposure process for pattern transfer.

When the poor pattern transfer is caused in the boundary region, various defects may be caused in the patterns of another layer which is formed in alignment with this transferred pattern in the follow-up processes. For example, when a pattern for defining an isolation structure or an active region is transferred poorly in the boundary region, a pattern defect such as a bridge may be caused in gates of transistor that is formed so as to cross the subsequently formed active region.

Therefore, it is required a method for transferring patterns disposed in the boundary region between the cell region, in which patterns are densely disposed, and an outer core region or a peripheral region onto the wafer with more accuracy and no shape distortion.

SUMMARY OF THE INVENTION

In one embodiment, a method for forming patterns of a semiconductor device includes: arranging dense patterns to be transferred in a dense pattern region of a wafer; inserting a first dummy pattern for restricting pattern distortion of the dense patterns in an outside of the array of the dense patterns; inserting a first assist feature for restricting pattern distortion of the first dummy pattern in an inside of the first dummy pattern; designing a pattern layout to be transferred onto the wafer by inserting an array of second assist features for additionally restricting pattern distortion of the first dummy pattern in an outside of the first dummy pattern; and forming an array of the dense patterns and the first dummy patterns by transferring the pattern layout onto the wafer through an exposure.

The method may further include: inserting an array of second dummy patterns having critical dimension and shape equal to those of the dense pattern between the first dummy patterns and the dense patterns.

The first assist feature may be set to a space pattern when the first dummy pattern is set to a solid body pattern, and the first assist feature may be set to a solid body pattern when the first dummy pattern is set to a space pattern.

The second assist features may be inserted as bar patterns extending in a direction perpendicular to the arranged direction of the dummy pattern.

The step of transferring the pattern layout onto the wafer through the exposure is carried out using an asymmetric illumination having poles disposed in the extending direction of the bar pattern.

The asymmetric illumination is a dipole illumination having two corresponding poles disposed in the extending direction of the bar pattern.

The second assist features may include first bar patterns extending in a direction perpendicular to the arranged direction of the dummy patterns; and second bar patterns extending longer than the first par features and having an end disposed adjacently to a space between the dummy patterns.

The second assist features may be inserted as bar patterns extending in a direction parallel to the arranged direction of the dummy pattern.

In another embodiment, a method for forming patterns of a semiconductor device includes: repeatedly disposing cell patterns for setting an active region in a cell region of a wafer; disposing a first dummy pattern having larger critical dimension than the cell pattern and restricting pattern distortion of the cell patterns in an outside of the array of the cell patterns; inserting a first assist feature for restricting pattern distortion of the first dummy pattern in an inside of the first dummy pattern as a space pattern; designing a pattern layout to be transferred onto the wafer by inserting an array of second assist features for additionally restricting pattern distortion of the first dummy pattern in an outside of the first dummy pattern as bar patterns extending in a direction perpendicular to the arranged direction of the dummy patterns and having an end disposed adjacently to the dummy pattern; and forming an array of the cell patterns for exposing the isolation region of the wafer and the first dummy patterns by transferring the pattern layout onto the wafer through an exposure.

In still another embodiment, a method for forming patterns of a semiconductor device includes: repeatedly disposing contact holes overlapped in an active region of a wafer; disposing a first dummy contact holes for restricting pattern distortion of the contact holes in an outside of the array of the contact holes; inserting a first assist feature for restricting pattern distortion of the first dummy contact holes in an inside of the first dummy contact holes; designing a pattern layout to be transferred onto the wafer by inserting an array of second assist features for additionally restricting pattern distortion of the first dummy contact holes in an outside of the first dummy contact holes; and forming an array of the contact holes and the first dummy contact holes by transferring the pattern layout onto the wafer through an exposure.

the first dummy contact hole is set so as to have an equal shape to that of the contact hole but have larger critical dimension than that of the contact hole, and the method may further include: inserting an array of second dummy contact holes having shape and critical dimension equal to those of the contact hole between the first dummy contact hole and the contact hole.

The first assist feature may be set to a solid body pattern when the first dummy contact hole is set to a space pattern.

The second assist features may be inserted as bar patterns extending in a direction perpendicular to the arranged direction of the dummy contact holes.

Embodiments of the present invention can provide a method for forming patterns of a semiconductor device, which is capable of restricting that poor pattern transfer is caused in a boundary region between a dense pattern region and an outer isolated pattern region, by introducing a mixed assist feature system.

DESCRIPTION OF SPECIFIC EMBODIMENTS

Figure 1:
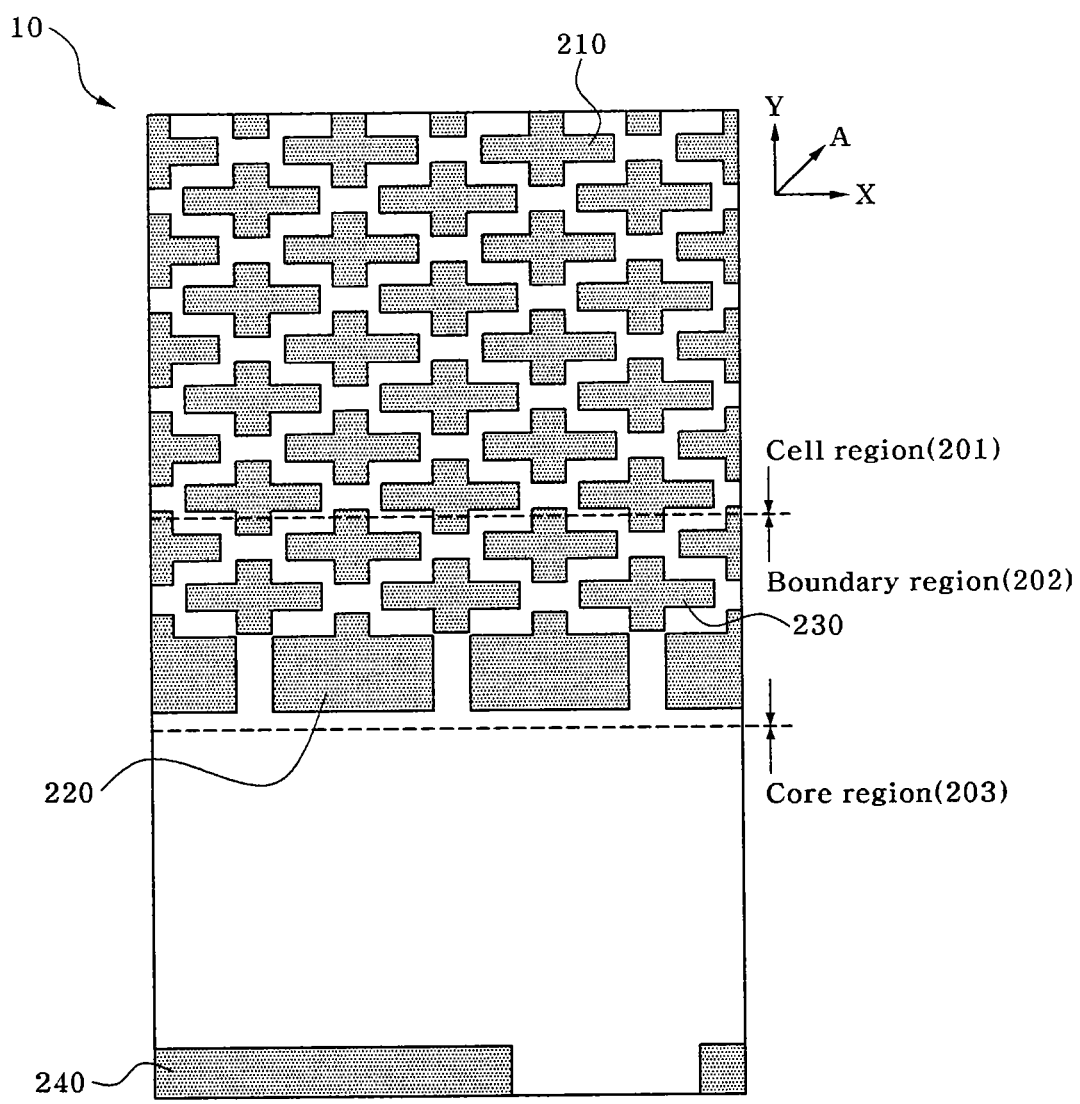
FIGS. 1 and 2 illustrate a layout of pattern array of a semiconductor device in accordance with a first embodiment of the present invention.

Embodiments of the present invention provide methods for forming array of cell patterns, which is formed to cover an active region formed with memory cells of a semiconductor device such as a DRAM memory device and sets an isolation region, with distortion or perversion in pattern transfer being restricted. Dense patterns such as cell patterns, patterns having substantially equal shape are formed so as to be disposed with relatively narrow spacing distances. A dense region formed with these dense patterns adjoins an isolated pattern region in which an isolated pattern having relatively wide spacing distance is disposed.

When transferring the array of dense patterns onto a wafer through an exposure process, different exposure environments are caused in respective regions dependently of the pattern densities in the dense region and the isolated pattern region. Therefore, during the exposure process focused to the pattern transfer of the dense patterns in the dense region, poor or distorted pattern transfer may be caused in the patterns disposed in a boundary region between the dense region and the isolated pattern region. To restrict the pattern distortion in the boundary region, embodiments of the present invention introduce an array of dummy patterns into an outside of the array of the dense patterns and introduce a first assist feature into an inside of the dummy pattern. Also, a second assist feature is introduced into an outside of the dummy pattern.

At this time, the first assist feature and the second assist feature may be introduced in different shapes. For example, the first assist feature may be introduced as a space pattern into the inside of the dummy pattern that is introduced as a substantially solid body pattern, and the second assist feature may be introduced as a bar shaped solid pattern. By introducing the first assist feature of a space pattern into the inside of the dummy pattern, it is possible to effectively restrict that the poor or distorted pattern transfer of the dummy pattern.

Meanwhile, in order to make action and effect of the second assist feature to be more effective in a dipole illumination that is introduced for accurately transferring patterns with finer critical dimension, the bar pattern of the second assist feature may be introduced in a linear shape extending in a direction in which poles of corresponding two light projecting regions of the dipole illumination are disposed, i.e. in a direction equal to the pole axis direction.

The second assist feature causes light scattering or light interference for restricting the pattern distortion during the exposure process, this interference may be interpreted to depend on the critical dimension. In the embodiments of the present invention, since the second assist feature is introduced a linear shaped bar pattern extending along the direction of the pole axis of the dipole illumination, it is possible to more effectively increase the critical dimension of the second assist feature by the resolution relatively lowered with respect to the line pattern extending in the direction of the pole axis of the dipole illumination. Therefore, it is possible to more effectively restrict the distorted or poor pattern transfer of the dummy pattern disposed adjacently to the second assist feature.

A mixed assist feature system in that these first and second assist features are introduced together can provide advantageous effect in restricting the distortion of the patterns disposed outside the dense patterns. This effect of restricting the pattern distortion can be confirmed through the result from modeling and simulating the process of pattern transfer through the exposure. By this effect of restricting the pattern distortion, a defocus margin in the exposure process, i.e. an extent of the defocus value within a limit, in which the pattern defect is restricted, from the best focus value can be ensured more widely. Therefore, it is possible to ensure more margin in the exposure process for transferring patterns with an extremely fine critical dimension of less than 50 nm.

These embodiments of the present invention may be used to form array of cell patterns used to set an active region by forming an isolation structure or isolation patterns as well as to form an array of contact holes overlapped on the active region. The process of forming the contact hole can be applied to a process for forming a storage node contact hole introduced for a contact structure for electrically connecting a source of a cell transistor and a storage node of a capacitor in a DRAM memory device. Otherwise, this method of forming the contact hole may be applied to a process for forming an opening hole that penetrates through a sacrificial layer, to realize the storage node in a cylindrical shape.

As such, when the embodiments of the present invention are applied to the process of forming the array of contact holes, the first assist feature may be introduced as a solid body pattern into the inside of the dummy pattern that is set as the contact hole, substantially a space pattern, and, on the contrary, the second assist feature may be introduced as a bar shaped space pattern.

FIGS. 1 to 4 illustrate a method for forming patterns of a semiconductor device in accordance with a first embodiment of the present invention.

Figure 2:
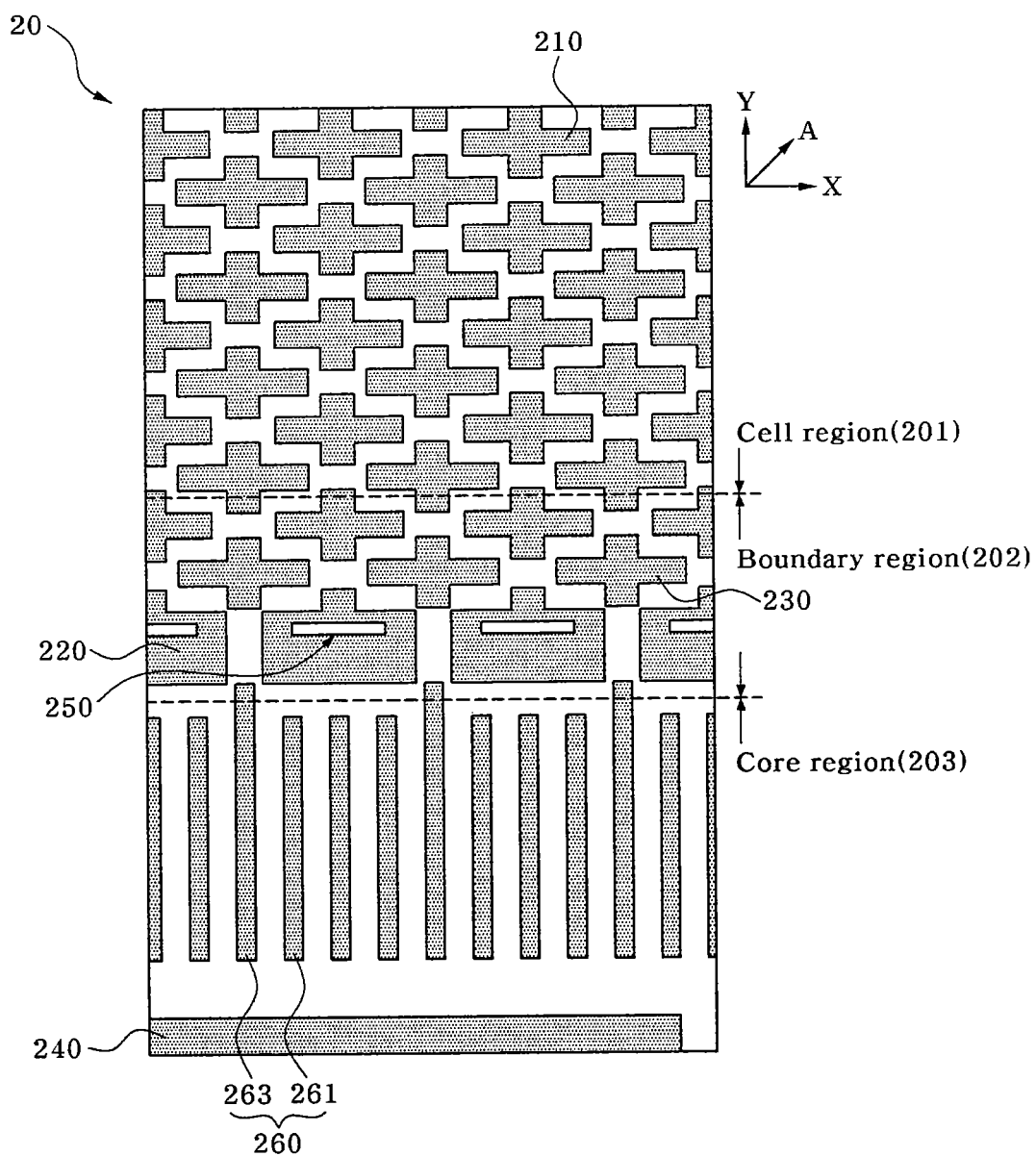

FIGS. 1 and 2 illustrate a layout of pattern array of a semiconductor device in accordance with a first embodiment of the present invention. A layout design is carried out, which disposes dense patterns for transferring the pattern layout 10 of FIG. 1, e.g. an array of cell patterns 210 for exposing an isolation region for setting an active region onto a wafer through an exposure process, in a dense pattern region, i.e. the cell region 201.

The cell pattern 210 is designed to provide a cross(+)-shaped active region in a case of DRAM memory device. The cross-shaped cell pattern 210 is designed so that the portion extending in X-axis direction, a major axis direction is longer than the portion extending in Y-axis direction, a minor axis direction. a drain of the cell transistor is formed at the crossed portion of the active region and a source is formed at the portion extending in X-axis direction. This cell pattern 210 is disposed repeatedly with substantially equal shape and spacing distance. At this time, a gate that functions as a word line is disposed in Y-axis direction, and a bit line that crosses the word line is disposed in X-axis direction. the word line and the bit line form a matrix, and the cell patterns 210 are disposed in such a form that they are arranged repeatedly in a direction of an oblique line (A) in order that the cell transistors are disposed more densely in the crossed portion of the word line and the bit line.

The cell region 201, a dense pattern region adjoins an isolated pattern region such as a core region 203 in which a sub word line driver for driving word line signal flowing on the word line is disposed. Otherwise, the cell region 201 may adjoin a peripheral region in which a word line driver connected with the sub word line driver of the core region 203. In This isolated pattern region such as the core region 203, a core pattern that sets an active region constituting the sub word line driver may be disposed as an isolated pattern 240. At this time, the isolated pattern 240 and the cell pattern 210 are disposed with larger spacing distance than the spacing distance between the cell patterns 210.

During the pattern transfer process, the cell pattern 210 located at an edge of the cell region 201 is exposed in an exposure environment different from that of the inside of the cell region 201 due to an influence by the large spacing distance between the cell region 210 and the isolated pattern 240 of the isolated pattern region 203 adjacent to the cell region 201. Therefore, even when the cell pattern 210 in an inside of the cell region 210 is transferred with an accurate pattern shape, distorted or poor pattern transfer may be caused at the cell pattern located in the edge of the cell region 201. In order to restrict this poor pattern transfer, a first dummy pattern 220 having larger critical dimension than the cell pattern 210 is inserted in a boundary region that is an outer region of the cell region in which the cell pattern 210 is disposed. The first dummy pattern 220 induces an action of restricting pattern distortion of the cell pattern 210 during pattern transfer by exposure.

Between the first dummy pattern 220 and the cell pattern 210, an array of second dummy patterns 230 having a shape and critical dimension equal to the cell pattern 210 may be additionally inserted, for example, in two rows. This second dummy pattern 230 induces an effect of additionally restricting the distorted or poor pattern transfer of the cell pattern 210. The first and second dummy patterns 220 and 230 are realized over a photomask as a mask pattern and transferred onto a wafer, but are used as patterns for patterning dummy active regions in which that the cell transistor are not actually constituted.

The first dummy pattern 220 disposed in the boundary region 202 is disposed so as to directly adjoin the isolated pattern region such as the core region 203. Therefore, when the first dummy pattern 220 is transferred through an exposure process, shape distortion and poor pattern transfer of this first dummy pattern 220 may be caused. This pattern defect of the first dummy pattern 220 causes a shape defect in the dummy active region and may result in a defect such as a bridge in a gate portion that passes across the dummy active region upon subsequent gate patterning of the cell transistor. Further, in a case of a recess gate structure in that a channel width is widened to increase drain current of the cell transistor, the pattern defect in the dummy active region may cause a defect in firming of the recess, thereby resulting in a gate bridge.

Referring to the layout 20 in FIG. 2, in order to restrict the pattern defect of the first dummy pattern 220, a first assist feature 250 that restricts the pattern distortion of the first dummy pattern 220 is inserted as a space pattern in an inside of the first dummy pattern 220. The first assist feature 250 induces an interference action on a light having an image of the first dummy pattern 220 upon the exposure and thus induces the image of the first dummy pattern 220 to be transferred more accurately and exactly onto the wafer. At this time, the first assist feature 250 is set to such a narrow critical dimension that it does not transferred onto the wafer and thus does not result in resist residue.

Meanwhile, in order to more effectively restrict the pattern distortion or pattern defect upon the pattern transfer, a second assist feature 260 that additionally restricts the pattern distortion of the first dummy pattern is inserted in the isolated pattern region such as the core region 203. This second assist feature 260 is formed to a bar shaped pattern extending Y-axis direction, the minor axis direction of the cell pattern 210. The reason that the bar pattern is set in the Y-axis direction is because, when introducing an asymmetric illumination such as a dipole illumination in which poles are disposed in Y-axis direction to enhance the resolution in X-axis direction, the major axis direction, into the exposure process, it is more effective to restrict the shape distortion of the first dummy pattern 220 since a critical dimension of the second assist feature can become more larger. In the example shown in FIG. 2, the second assist features 260 are inserted as bar patterns extending in a direction perpendicular to an arranged direction of the first dummy patterns 220. The bar patterns are distributed along the arranged direction of the first dummy patterns 220. Meanwhile, this second assist feature 260 may be introduced with a mixed form of a first bar pattern 261 having a relatively short length and a second bar pattern 263 having a relatively long length. Since the end of the second bar pattern 263 extends so as to adjoin a space between the first dummy pattern 220 and adjacent another first dummy pattern 220, it is advantageous to more effectively induce the light interference effect upon the pattern transfer of the first dummy pattern 220.

Figure 3:
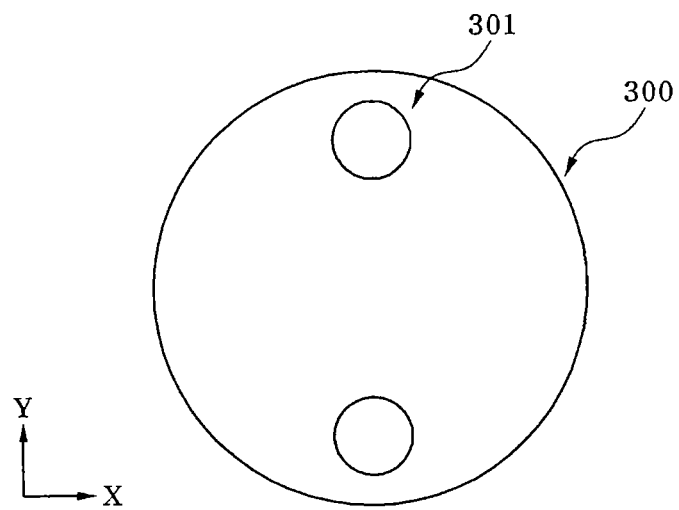
FIG. 3 illustrates a dipole illumination applied to a method for forming the pattern array of a semiconductor device in accordance with a first embodiment of the present invention.

After designing the pattern layout 20 to be transferred onto the wafer, the pattern layout 20 is realized as a mask pattern on a mask substrate such as a transparent crystal substrate, thereby forming a photomask. After that, an exposing light is incident to the photomask and the light transmitted the photomask is then reached to the wafer, thereby exposing the resist layer on the wafer. At this time, as shown in FIG. 3, a dipole illumination 300 may be introduced, in which two poles 301 for transmitting the light are correspondingly disposed in Y-axis direction, the minor axis direction of the cell pattern (210 in FIG. 2), and in other words, the poles 301 are disposed in the pole axis direction of Y-axis direction. This dipole illumination 300 relatively increases the contrast of the pattern extending in X-axis direction, the major direction of the cell pattern 210 and thus is effective to realize finer pattern transfer of the cell pattern 210.

Figure 4:
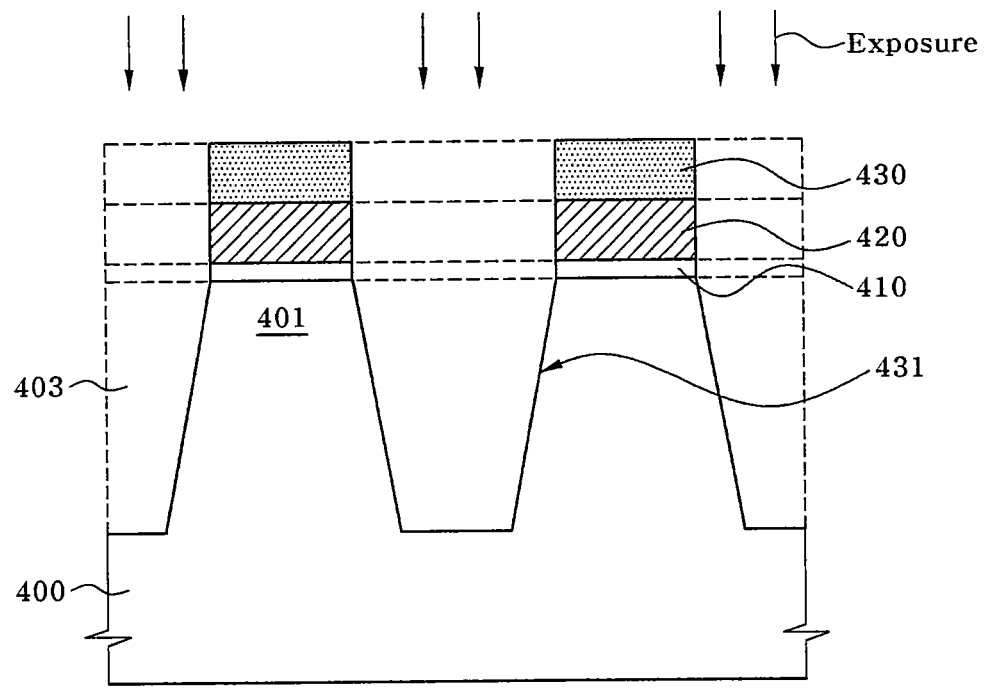
FIG. 4 is a cross-sectional view illustrating the method for forming the pattern array of a semiconductor device in accordance with a first embodiment of the present invention.

By this pattern transfer process, as shown in FIG. 4, the resist layer formed on the wafer 400 is selectively exposed and the resist pattern 430 is then formed in accordance with the shape of the cell pattern 210 by the subsequent developing process. After that, a nitride pad 420 and an oxide pad 410 provided below the resist pattern 430 are patterned using the resist pattern 430 as an etch mask, and the resulting exposed portion of the wafer 400 is selectively etched to form a trench 431 for isolation. After that, an isolation insulation layer 403 for filling the trench 431 is formed, thereby forming an isolation structure that sets the active region 401.

When transferring the pattern layout 20 in accordance with the embodiment of the present invention constituted as shown in FIG. 2 onto the wafer (400 in FIG. 4) using the Y-axial dipole illumination 300 as shown in FIG. 3, shapes of not only the cell pattern (210 in FIG. 2) but also the first dummy pattern 220 of the boundary region 202 can be transferred more accurately and exactly onto the resist pattern (430 in FIG. 4). Such effect of the present invention can be confirmed by a pattern contour resulted from modeling and simulating the exposure and development processes.

Figure 5:
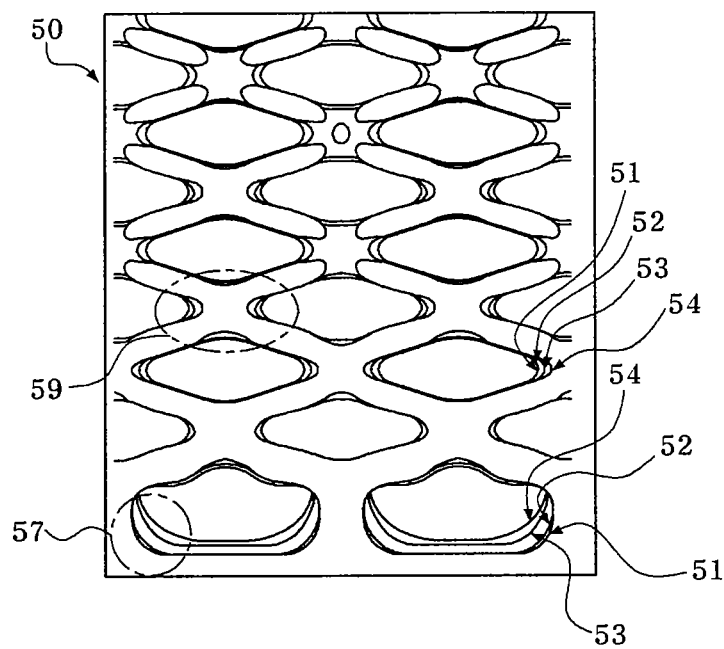
FIGS. 5 and 6 are simulated contours showing effect by a mixed assist feature system in accordance with a first embodiment of the present invention.
Figure 6:
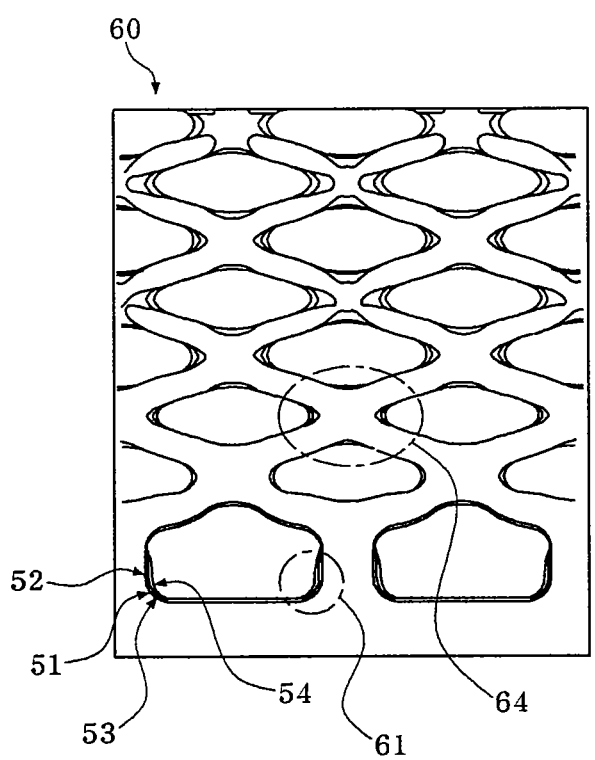

FIGS. 5 and 6 are simulated contours showing effect by a mixed assist feature system in accordance with a first embodiment of the present invention. FIG. 5 shows a first contour 50 resulted from simulating with respect to the pattern layout 10 in FIG. 1 as a comparative example, and FIG. 6 shows a second contour 60 resulted from simulating with respect to the pattern layout 20 in FIG. 2 that introduces the mixed assist feature system therein. The contours 50 and 60 in FIGS. 5 and 6 are resulted from simulating with respect to a first case 51 of the best focus of about 0.21 µm, a second case 52 defocused by 50 µm with respect to the best focus, a third case 53 defocused by 100 µm with respect to the best focus and a third case 54 defocused by 120 µm with respect to the best focus, upon exposure. At this time, the simulation is carried out for the exposure process accompanied with Y-axial dipole illumination (300 in FIG. 3).

A first point 57 of the resulting contour 50 in FIG. 5 shows that the contour of the first dummy pattern (220 in FIG. 1) is largely deformed dependently of an amount of the defocus. Also, a second point 59 of the resulting contour 50 including the cell pattern (210 in FIG. 1) shows that the contour of the cell pattern 210 is also significantly deformed dependently of the amount of the defocus. In contrast, a third point 61 of the resulting contour 60 in FIG. 6 shows that the contour of the first dummy pattern (220 in FIG. 2) is not largely deformed relatively independently of the amount of the defocus. Also, a fourth point 64 of the resulting contour 60 in FIG. 6 including the cell pattern (210 in FIG. 1) shows that the contour of the cell pattern 210 is also not largely deformed relatively independently of the amount of the defocus. These results proves that it is possible to effectively restrict the pattern defect or the pattern distortion upon pattern transfer of the first dummy pattern 220 and the cell pattern 210 by introducing the mixed assist feature system including the first assist feature 250 and the second assist feature 260 in accordance with the embodiment of the present invention.

This effect by the mixed assist feature system shows that it is possible to ensure far wider defocus margin as compared to the case of introducing independently the first assist feature 250 or the second assist feature 260.

Figure 7:
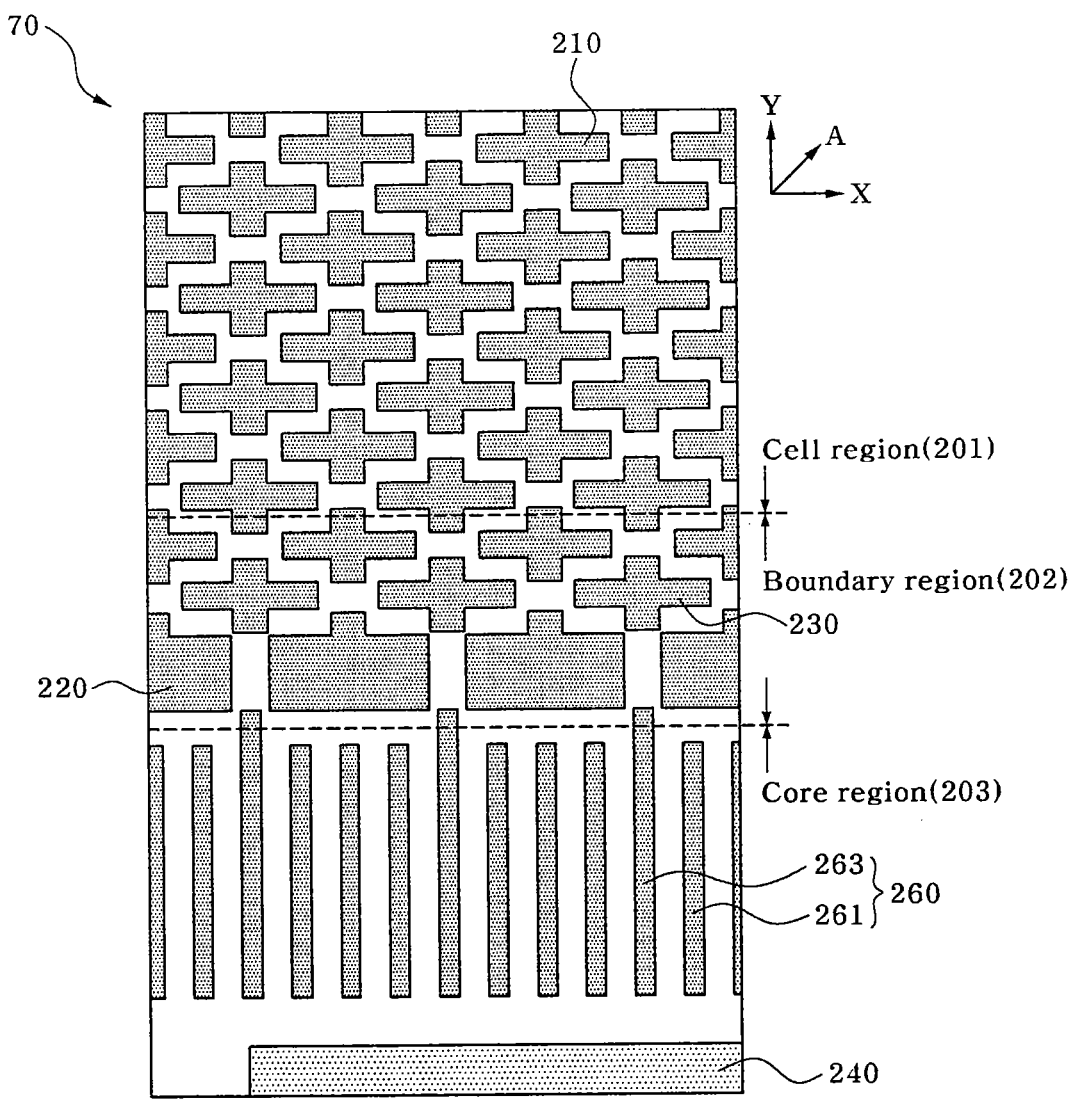
FIG. 7 illustrates a pattern layout resulted from introducing an Y-axis directional bar shaped assist feature in accordance with a first embodiment of the present invention.
Figure 8:
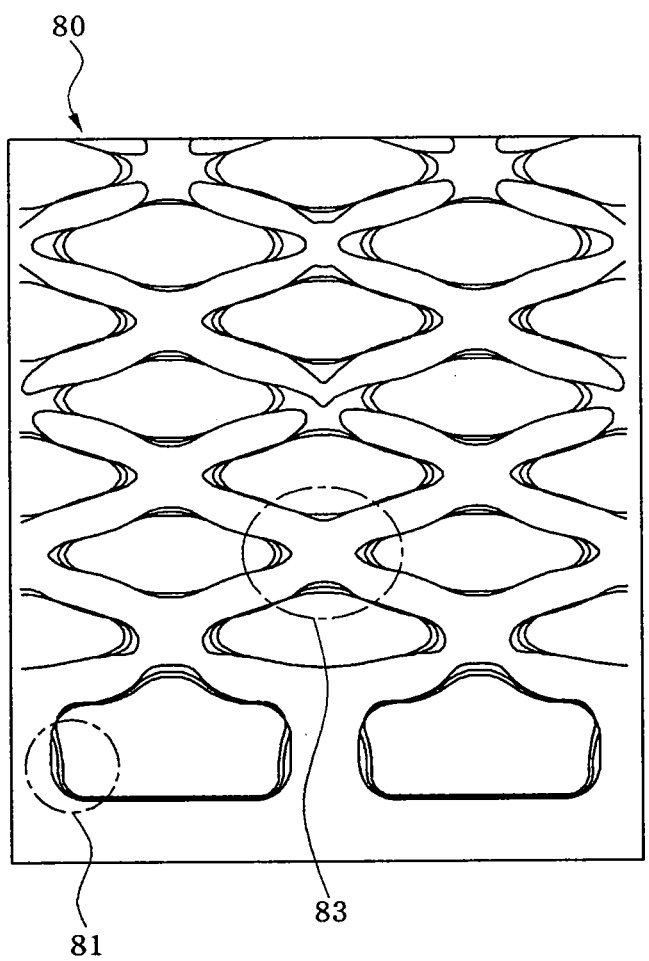
FIG. 8 illustrates a contour resulted from simulating the pattern layout in FIG. 7.

FIG. 7 illustrates a pattern layout resulted from introducing an Y-axis directional bar shaped assist feature in accordance with a first embodiment of the present invention. Herein, to explain the effect in accordance with the first embodiment of the present invention, the first assist feature (250 in FIG. 2) having a space pattern shape is excluded. FIG. 8 illustrates a contour resulted from simulating this pattern layout 80. In the case that the second assist feature 260 is introduced, as can be seen from the fifth point 81, the pattern distortion according to the defocus with respect to the first dummy pattern (220 in FIG. 7) is lessened as compared to the contour in the first point 57 in FIG. 5. Nevertheless, the pattern deformation according to the defocus is larger than in the third point 61 in FIG. 6. Also, as can be seen from the sixth point 83 with respect to the cell pattern 210, the pattern deformation according to the defocus with respect to the cell pattern 210 is also noticeably large. This result in FIG. 8 shows that the introduction of the second assist feature 260 alone in Y-axis direction has a limitation to ensure the defocus margin.

Figure 9:
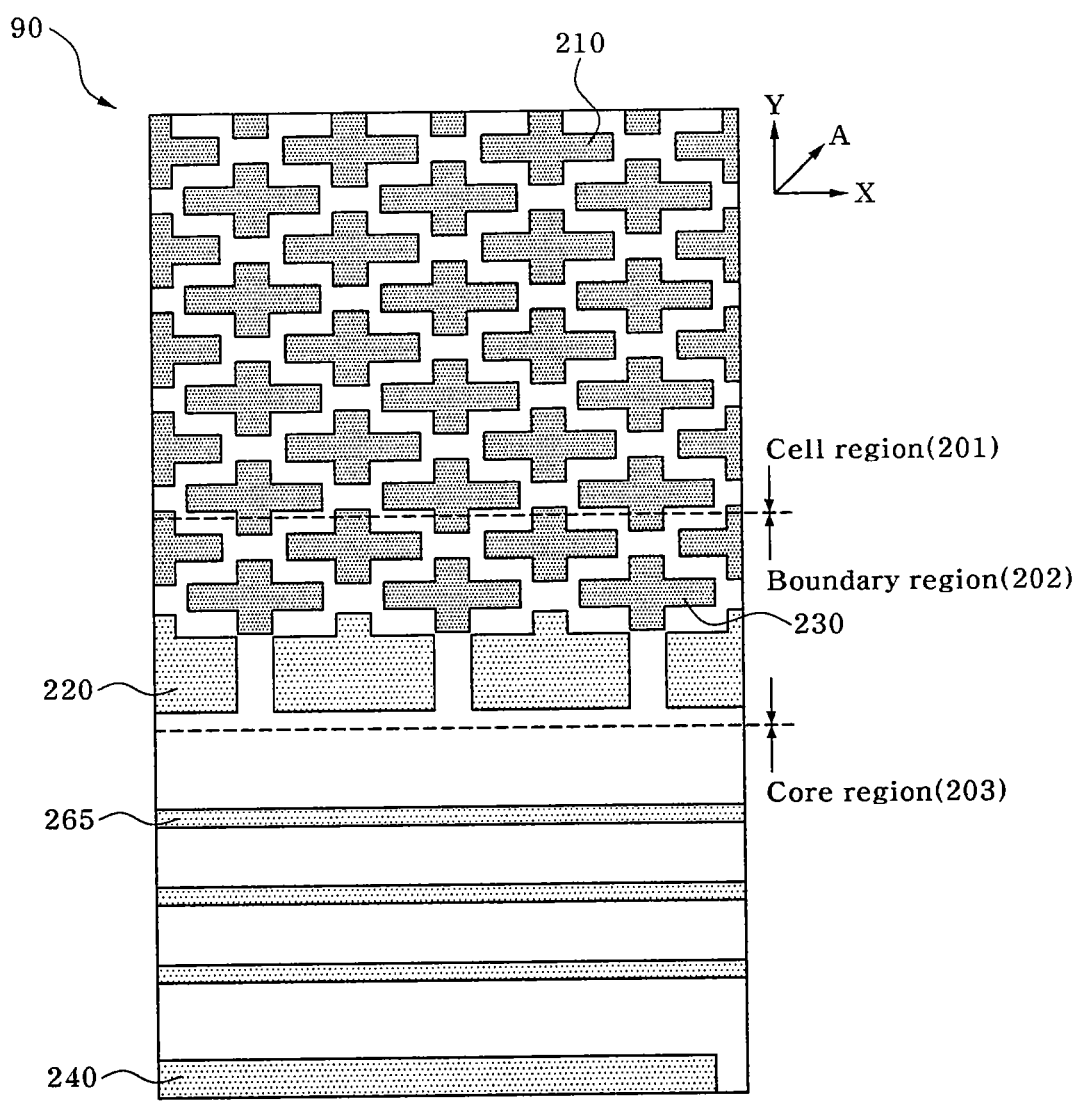
FIG. 9 illustrates a pattern layout resulted from introducing an X-axis directional bar shaped assist feature in accordance with a first embodiment of the present invention.
Figure 10:
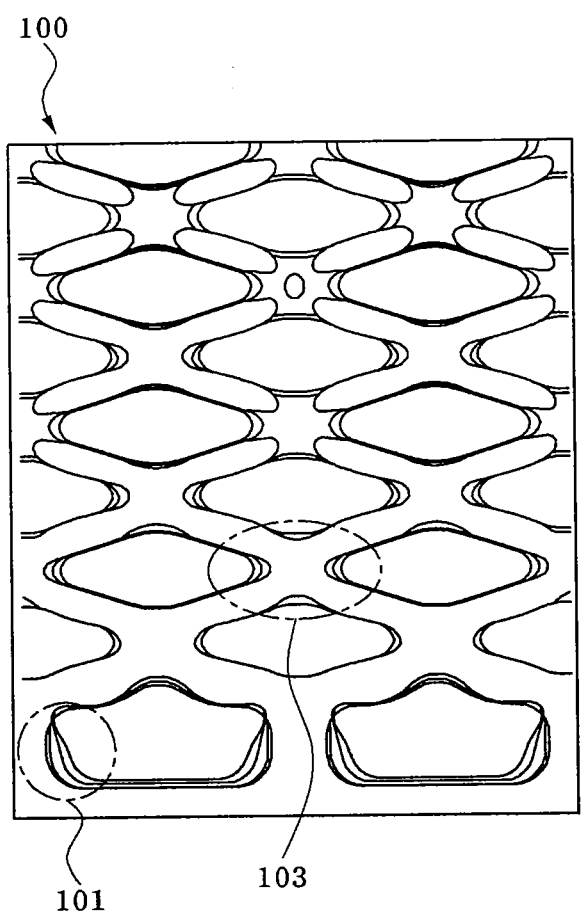
FIG. 10 illustrates a contour resulted from simulating the pattern layout in FIG. 9.

FIG. 9 illustrates a pattern layout resulted from introducing an X-axis directional bar shaped assist feature in accordance with a first embodiment of the present invention. Herein, to explain the effect in accordance with the first embodiment of the present invention, the first assist feature (250 in FIG. 2) having a space pattern shape is excluded. FIG. 10 illustrates a contour resulted from simulating this pattern layout. Referring to FIG. 10, in the case that the second assist feature 265 is introduced, as can be seen from the seventh point 101, the pattern distortion according to the defocus with respect to the first dummy pattern (220 in FIG. 9) is lessened as compared to the contour in the first point 57 in FIG. 5. Nevertheless, the pattern deformation according to the defocus is larger than in the fifth point 81 in FIG. 8. Also, as can be seen from the eighth point 103 with respect to the cell pattern 210, the pattern deformation according to the defocus with respect to the cell pattern 210 is also noticeably large. This result in FIG. 10 shows that the introduction of the second assist feature 260 alone in X-axis direction has the greater limitation to ensure the defocus margin.

Figure 11:
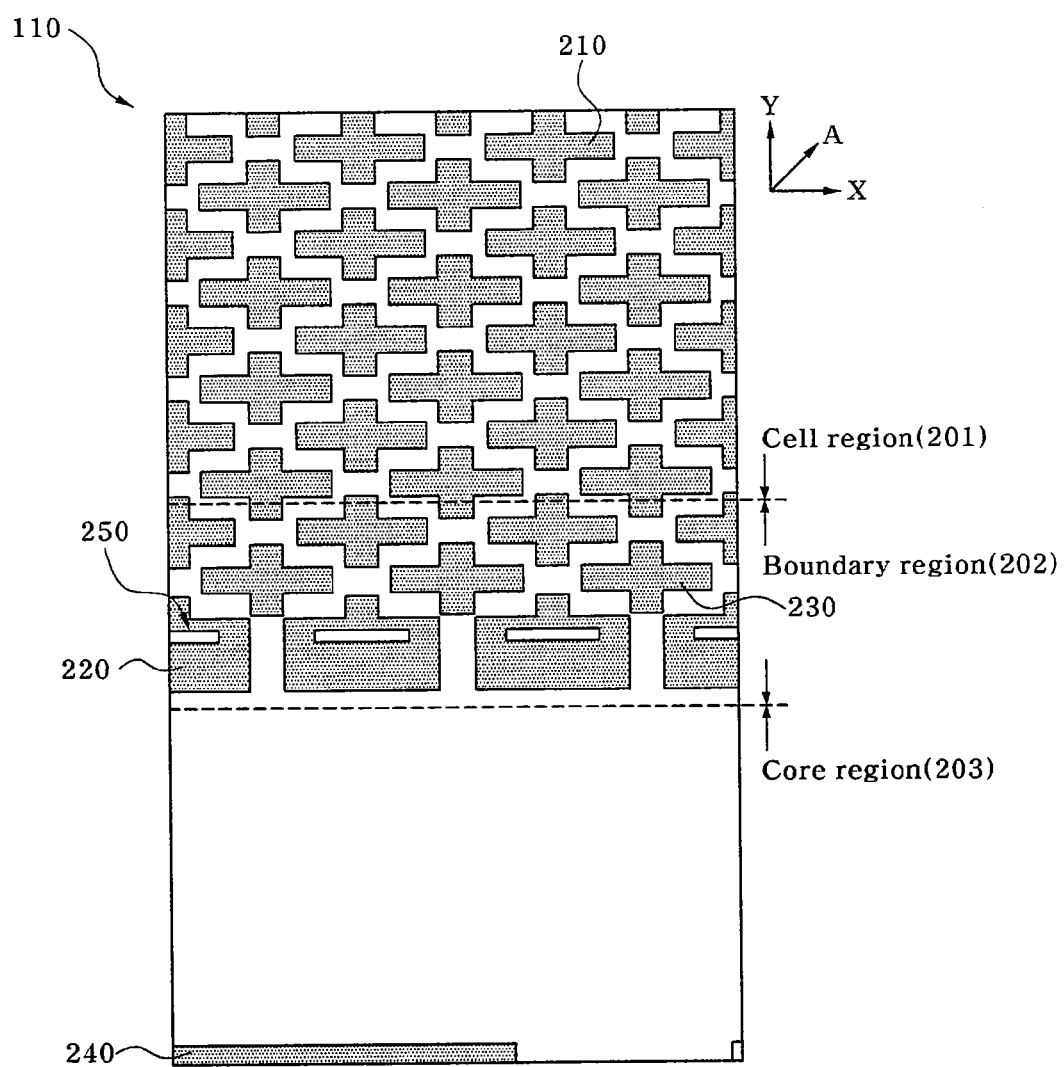
FIG. 11 illustrates a pattern layout resulted from introducing a space assist feature into a dummy pattern in accordance with a first embodiment of the present invention.
Figure 12:
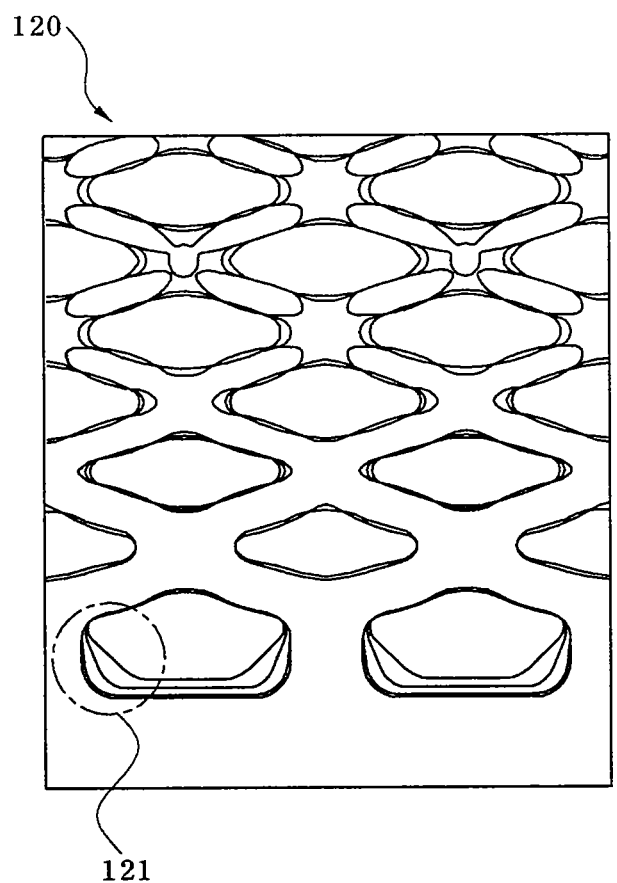
FIG. 12 illustrates a contour resulted from simulating the pattern layout in FIG. 11.

FIG. 11 illustrates a pattern layout 110 resulted from introducing the first assist feature 250 alone having a space pattern into the dummy pattern 220 in accordance with a first embodiment of the present invention. FIG. 12 illustrates a contour 120 resulted from simulating the pattern layout 110. As can be seen in a ninth point 121 in FIG. 12, the pattern distortion according to the defocus with respect to the first dummy pattern 220 is noticeably large. This result in FIG. 12 shows that the introduction of the first assist feature 250 the greater limitation to ensure the defocus margin.

Figure 13:
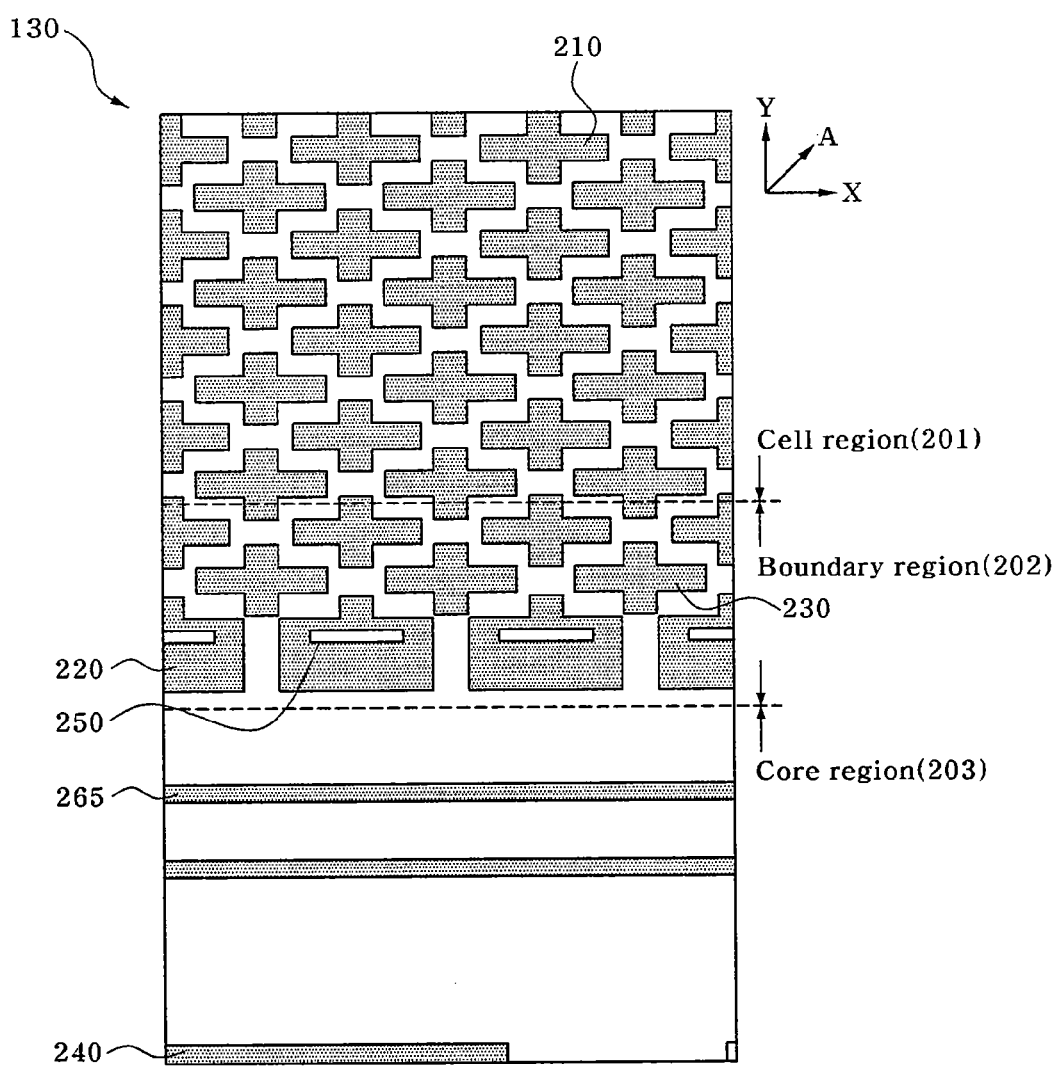
FIG. 13 illustrates a pattern layout resulted from introducing a space assist feature and an X-axis directional bar shaped assist feature in accordance with a first embodiment of the present invention.
Figure 14:
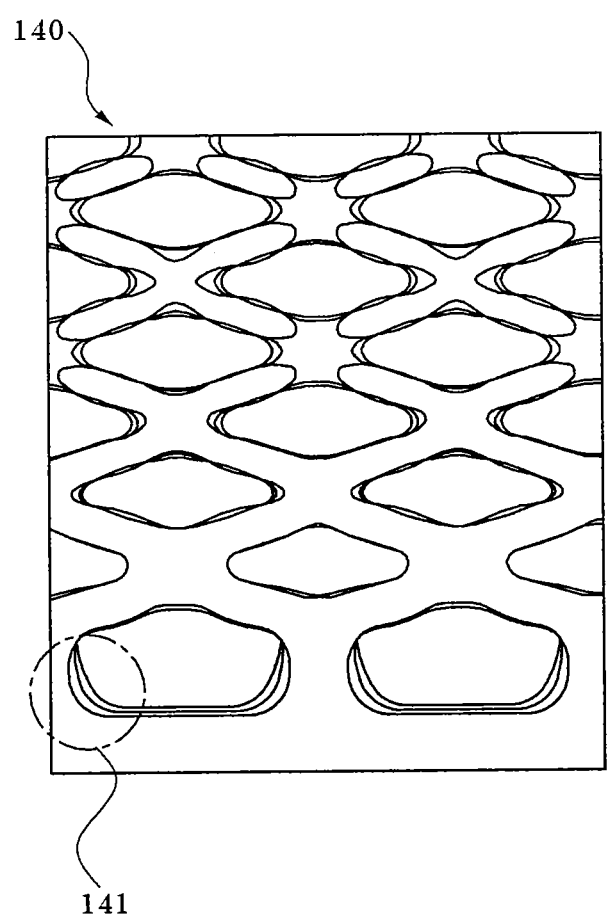
FIG. 14 illustrates a contour resulted from simulating the pattern layout in FIG. 13.

FIG. 13 illustrates a pattern layout 130 resulted from introducing the first assist feature 250 having a space pattern shape and the second assist feature 265 in X-axis direction in accordance with the first embodiment of the present invention. FIG. 14 illustrates a contour 140 resulted from simulating this pattern layout 130.

As can be seen from the tenth point 141 in FIG. 14, the pattern distortion according to the defocus with respect to the first dummy pattern 220 is noticeably lessened. Nevertheless, the effect of ensuring the defocus margin can be evaluated to be slightly low as compared to the resulting contour 50 in FIG. 6.

As described above, in the first embodiment of the embodiment, the first dummy pattern 220 is introduced outside of the cell pattern (210 in FIG. 2), the first assist feature 250 is inserted in the inside of the first dummy pattern 220 and the second assist feature 260 is inserted in the outside of the first dummy pattern 220. By the interaction of the first assist feature 250 and the second assist feature 260, it is possible to effectively restrict the poor pattern transfer of the first dummy pattern 220. Though the first embodiment of the present invention is exemplary described with respect to a process of forming an isolation structure, the first embodiment of the present invention may also applied to a process of forming an array of contact holes that are repeatedly disposed in the cell region.

Figure 15:
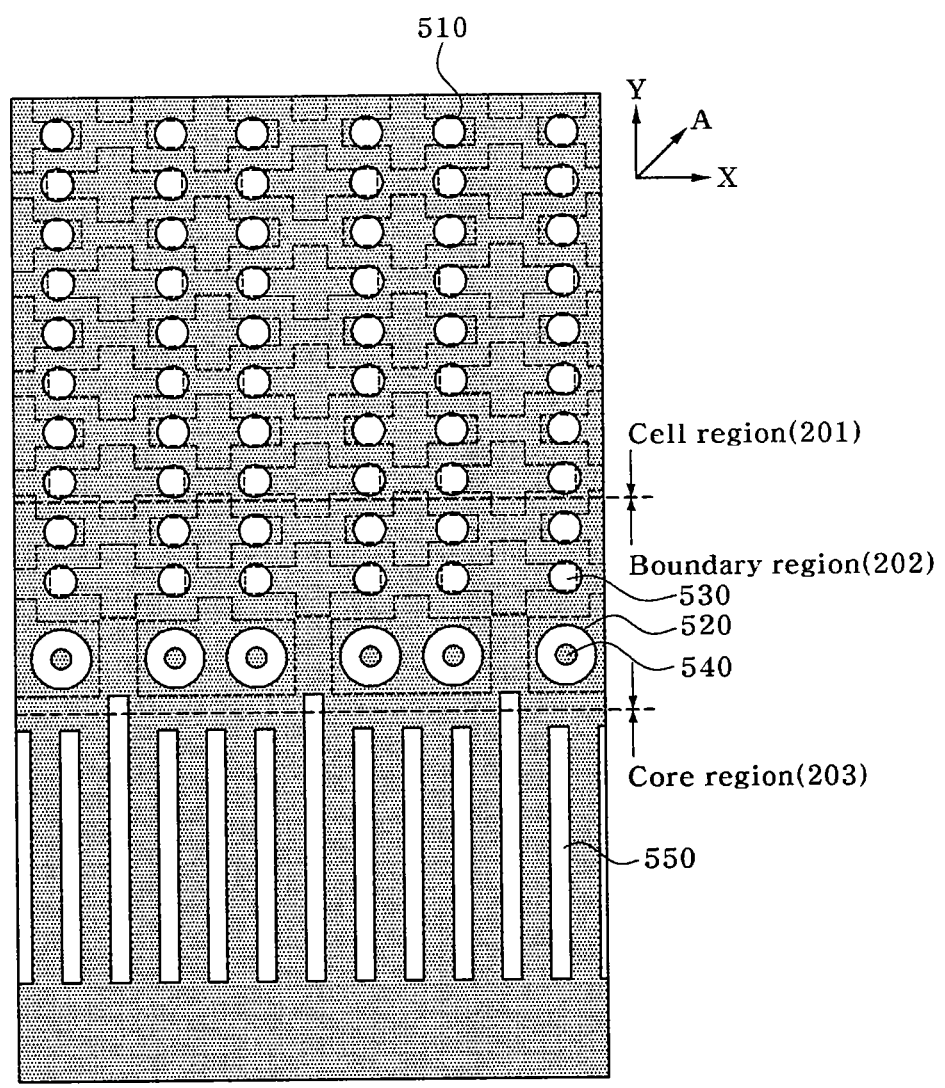
FIGS. 15 and 16 are plan view and cross-sectional view illustrating the method for forming the pattern array of a semiconductor device in accordance with a second embodiment of the present invention.
Figure 16:
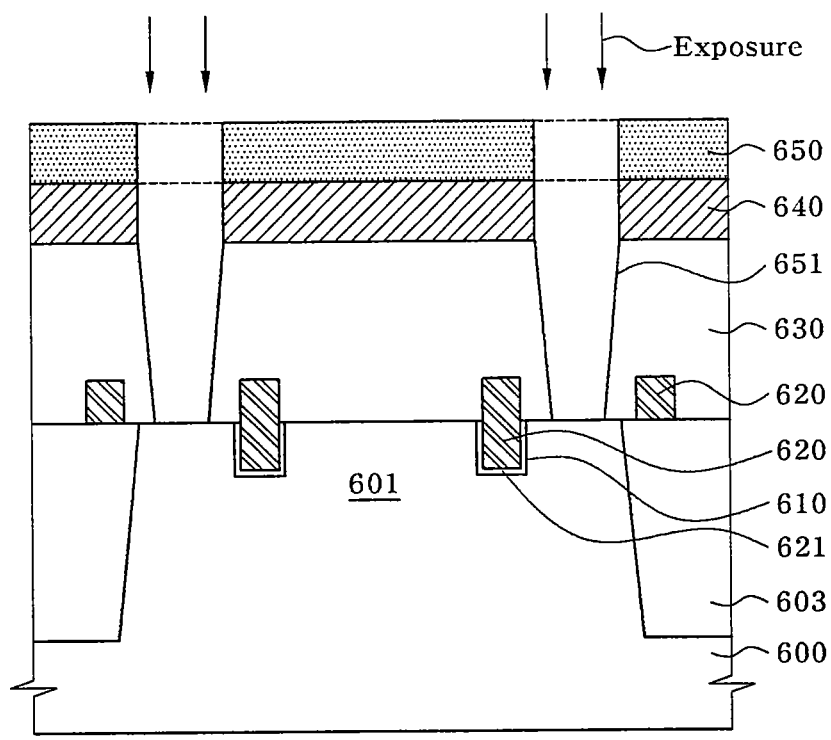

FIGS. 15 and 16 show the method for forming the pattern array of a semiconductor device in accordance with a second embodiment of the present invention. Referring to FIG. 15, a design is carried out so that cell contact holes 510 overlapped on an active region of a wafer are repeatedly arranged in the cell region 201. After that, first dummy contact holes 520 for restricting pattern distortion of the cell contact hole 510 are arranged in a boundary region 202 in an outside of the array of the cell contact holes 510. The first dummy contact hole 520 is designed so as to have larger critical dimension than the cell contact hole 510. Also, second dummy contact holes 530 having a critical dimension and shape equal to the cell contact hole 510 are arranged between the first dummy contact hole 520 and the cell contact hole 510, thereby restricting the pattern distortion.

A first assist feature 540 that is substantially a solid body pattern is inserted into the first dummy contact hole 540 to restrict the pattern deformation of the first dummy contact hole 540.

After designing the pattern layout 500 to be transferred onto the wafer as described above, the pattern layout 500 is realized as a mask pattern on a mask substrate such as a transparent crystal substrate, thereby forming a photomask. After that, an exposing light is incident to the photomask and the light transmitted the photomask is then reached to the wafer, thereby exposing the resist layer on the wafer. At this time, an exposure process introducing a dipole illumination in which the pole axis is disposed in Y-axis direction, i.e. in the arranged direction of the cell contact hole (510 in FIG. 15) as shown in FIG. 16 may be carried out.

By this pattern transfer process, as shown in FIG. 16, the resist layer formed on the wafer 600 is selectively exposed and the resist pattern 630 is then formed in accordance with the shape of the cell contact hole 510 by the subsequent developing process. After that, a hard mask 640 provided below the resist pattern 650 are patterned using the resist pattern 650 as an etch mask, and the resulting exposed portion of an insulation layer 630 is selectively etched to form a contact hole 651 that is connected to the active region 610. The contact hole 651 is formed so as to pass laterally of a recess gate 620, which is formed accompanying with a gate dielectric layer 621 to fill a recess groove 610 formed in the active region set by an isolation region 603, thereby inducing a contact structure connected to a source of the active region adjoining the gate 620. This method of forming the contact hole may be carried out for a storage node contact connected to a source of a transistor. Meanwhile, the second embodiment of the present invention may be applied to form an array of connection contacts having different shapes.

As is apparent from the above description, in the method for forming an array of patterns, it is possible to enhance the process margin of cell dummy pattern that had insufficient defocus margin or exposure process margin as compared to the cell region and thus lowered overall process margin. Accordingly, it is possible to enhance the yield of semiconductor.

While the present invention has been described with respect to the specific embodiments, it will be apparent to those skilled in the art that various changes and modifications may be made without departing from the spirit and scope of the invention as defined in the following claims.

What is claimed is:

1. A method for forming patterns of a semiconductor device, the method comprising:
   providing a photomask that includes
      a two-dimensional array of first patterns, the two-dimensional array of first patterns having a first density of the first patterns;
      a one-dimensional array of first dummy patterns for restricting pattern distortion of the first patterns, the first dummy patterns being disposed outside of the two-dimensional array of the first patterns;
      a one-dimensional array of first assist features for restricting pattern distortion of the first dummy patterns, each of the first assist features is disposed within a corresponding first dummy pattern; and
      an array of second assist features for additionally restricting pattern distortion of the first dummy patterns, the second assist features being disposed outside of the first dummy patterns; and
   forming an array of the first patterns and the first dummy patterns on a wafer by using the photomask as an exposure mask.

2. The method of claim 1, wherein the first dummy patterns have a larger critical dimension than that of the first patterns.

3. The method of claim 1, wherein the photomask further includes an array of second dummy patterns having a critical dimension and shape equal to those of the first patterns, the second dummy patterns being disposed between the first dummy patterns and the first patterns.

4. The method of claim 1, wherein the second assist features are inserted as bar patterns extending in a direction perpendicular to an arranged direction of the first dummy patterns, the bar patterns being distributed along the arranged direction of the first dummy patterns.

5. The method of claim 4, wherein using the photomask as an exposure mask is carried out using an asymmetric illumination having poles disposed in the extending direction of the bar pattern.

6. The method of claim 5, wherein the asymmetric illumination is a dipole illumination having two corresponding poles disposed in the extending direction of the bar pattern.

7. The method of claim 4, wherein forming an array of the first patterns and the first dummy patterns on a wafer comprises:
   using the photomask as an exposure mask using an asymmetric illumination having poles disposed in an extending direction of the two-dimensional array of the first patterns, an array of second dummy patterns, the one-dimensional array of the first dummy patterns, and the array of the second assist features.

8. The method of claim 1, wherein the second assist features comprises:
   first bar patterns extending in a direction perpendicular to an arranged direction of the first dummy patterns, the first bar patterns being distributed along the arranged direction of the first dummy patterns; and
   second bar patterns extending longer than the first bar patterns, each of the second bar patterns having an end disposed adjacently to a space between two of the first dummy patterns.

9. The method of claim 1, wherein the second assist features are inserted as bar patterns extending in a direction parallel to an arranged direction of the first dummy patterns, the bar patterns being distributed perpendicular to the arranged direction of the first dummy patterns.

10. The method of claim 1, wherein forming an array of the first patterns and the first dummy patterns on a wafer comprises:
    using the photomask as an exposure mask using an asymmetric illumination having poles disposed in an extending direction of the two-dimensional array of the first patterns, the one-dimensional array of the first dummy patterns, and the array of the second assist features.

11. A method for forming patterns of a semiconductor device, the method comprising:
    providing a photomask that includes
       a two-dimensional array of first patterns, the two-dimensional array of first patterns having a first density of the first patterns;
       a one-dimensional array of first dummy patterns for restricting pattern distortion of the first patterns, the first dummy patterns being disposed outside of the two-dimensional array of the first patterns;
       a one-dimensional array of first assist features for restricting pattern distortion of the first dummy patterns, each first assist feature being disposed inside a corresponding one of the first dummy patterns; and
       an array of second assist features for additionally restricting pattern distortion of the first dummy patterns, the second assist features being disposed outside of the first dummy patterns; and
    forming an array of the first patterns and the first dummy patterns on a wafer by using the photomask as an exposure mask;
    wherein each of the first assist features is set to a space pattern disposed inside each of the first dummy patterns which is set to a solid body pattern, or
    each of the first assist features is set to a solid body pattern disposed inside each of the first dummy patterns which is set to a space pattern.

* * * * *